United States Patent
Lee et al.

(10) Patent No.: US 9,627,206 B2
(45) Date of Patent: Apr. 18, 2017

(54) METHOD OF DOUBLE PATTERNING LITHOGRAPHY PROCESS USING PLURALITY OF MANDRELS FOR INTEGRATED CIRCUIT APPLICATIONS

(71) Applicant: Taiwan Semiconductor Manufacturing Company, Ltd., Hsin-Chu (TW)

(72) Inventors: Chung-Ju Lee, Hsin-Chu (TW); Hsin-Chieh Yao, Hsin-Chu (TW); Shau-Lin Shue, Hsin-Chu (TW); Tien-I Bao, Hsin-Shu (TW); Yung-Hsu Wu, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 14/937,366

(22) Filed: Nov. 10, 2015

(65) Prior Publication Data
US 2016/0079063 A1 Mar. 17, 2016

Related U.S. Application Data

(63) Continuation of application No. 14/087,334, filed on Nov. 22, 2013, now Pat. No. 9,209,076.

(51) Int. Cl.
*H01L 21/033* (2006.01)
*H01L 21/768* (2006.01)
*H01L 21/311* (2006.01)

(52) U.S. Cl.
CPC .... *H01L 21/0337* (2013.01); *H01L 21/31144* (2013.01); *H01L 21/76802* (2013.01); *H01L 21/76816* (2013.01); *H01L 21/76879* (2013.01)

(58) Field of Classification Search
CPC ........... H01L 21/76816; H01L 21/0337; H01L 21/3088; H01L 21/32139; H01L 21/0273;
(Continued)

(56) References Cited

U.S. PATENT DOCUMENTS

| 5,708,621 A | 1/1998 | Tanoi |
| 2010/0130016 A1 | 5/2010 | DeVilliers |

(Continued)

FOREIGN PATENT DOCUMENTS

CN 102479700 A 5/2012

*Primary Examiner* — Thomas L Dickey
*Assistant Examiner* — Changhyun Yi
(74) *Attorney, Agent, or Firm* — Slater Matsil, LLP

(57) ABSTRACT

A method includes performing a double patterning process to form a first mandrel, a second mandrel, and a third mandrel, with the third mandrel being between the first mandrel and the second mandrel, and etching the third mandrel to cut the third mandrel into a fourth mandrel and a fifth mandrel, with an opening separating the fourth mandrel from the fifth mandrel. A spacer layer is formed on sidewalls of the first, the second, the fourth, and the fifth mandrels, wherein the opening is fully filled by the spacer layer. Horizontal portions of the spacer layer are removed, with vertical portions of the spacer layer remaining un-removed. A target layer is etched using the first, the second, the fourth, and the fifth mandrels and the vertical portions of the spacer layer as an etching mask, with trenches formed in the target layer. The trenches are filled with a filling material.

20 Claims, 15 Drawing Sheets

(58) Field of Classification Search
CPC ............. H01L 21/0338; H01L 21/3086; H01L 21/31144; H01L 27/10; H01L 27/1052; H01L 23/481
USPC .......................... 438/305, 478, 637, 675, 703
See application file for complete search history.

(56) References Cited

U.S. PATENT DOCUMENTS

| | | |
|---|---|---|
| 2011/0195576 A1 | 8/2011 | Ko et al. |
| 2011/0275218 A1 | 11/2011 | Liang et al. |
| 2012/0074583 A1* | 3/2012 | Dao .................. H01L 21/76898 257/774 |
| 2012/0225550 A1 | 9/2012 | Blatchford |
| 2012/0225560 A1 | 9/2012 | Gouraud et al. |
| 2012/0241975 A1* | 9/2012 | Farys .................. G06F 17/5081 257/774 |
| 2014/0370684 A1 | 12/2014 | Khurana et al. |
| 2015/0047891 A1 | 2/2015 | Lee et al. |

* cited by examiner

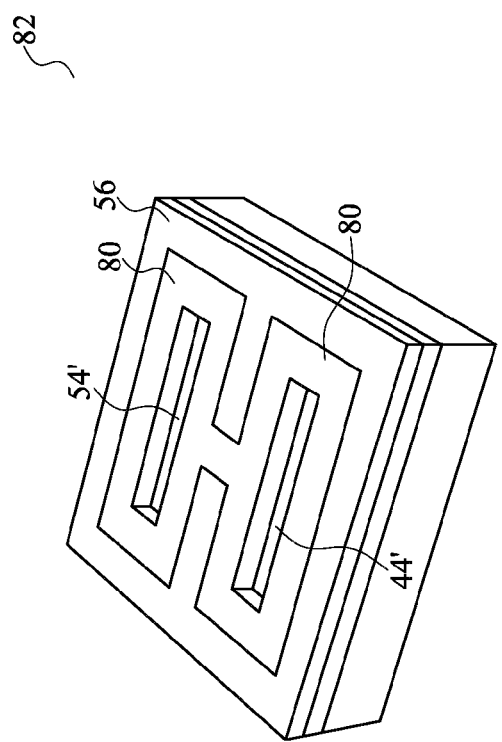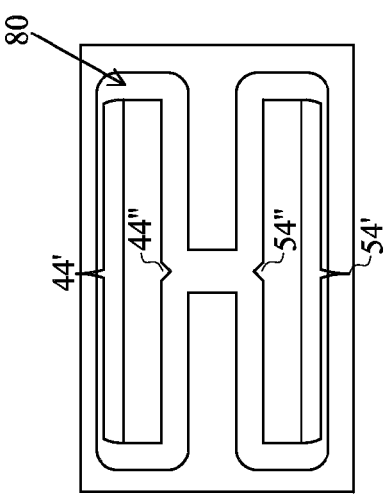
Fig. 9A
Fig. 9B

METHOD OF DOUBLE PATTERNING LITHOGRAPHY PROCESS USING PLURALITY OF MANDRELS FOR INTEGRATED CIRCUIT APPLICATIONS

PRIORITY CLAIM AND CROSS-REFERENCE

This application is a continuation of U.S. patent application Ser. No. 14/087,334, entitled "Method of Double Patterning Lithography Process Using Plurality of Mandrels for Integrated Circuit Applications," filed on Nov. 22, 2013, which application is incorporated herein by reference.

BACKGROUND

Double patterning is a technology developed for lithography to enhance the feature density. Typically, for forming features of integrated circuits on wafers, the lithography technology is used, which involves applying a photo resist, and defining features on the photo resist. The features in the patterned photo resist are first defined in a lithography mask, and are implemented either by the transparent portions or by the opaque portions in the lithography mask. The features in the patterned photo resist are then transferred to the manufactured features.

With the increasing down-scaling of integrated circuits, the optical proximity effect posts an increasingly greater problem. When two separate features are too close to each other, the optical proximity effect may cause the features to be shorted to each other. To solve such a problem, double patterning technology is introduced. In the double patterning technology, the closely located features are separated to two photolithography masks of a same double-patterning mask set, with both masks used to expose the same photo resist, or used to pattern the same hard mask. In each of the masks, the distances between features are increased over the distances between features in the otherwise a single mask, and hence the optical proximity effect is reduced, or substantially eliminated in the double patterning masks.

The double patterning, however, also suffers from drawbacks. For example, when two features have their lengthwise directions aligned to a same straight line, and the line ends of the features face each other, it is difficult to control the uniformity of the line end space due to the proximity effect and overlay variation. The line widths of the features are also difficult to control, especially when there are other features close to these two features.

The double patterning, however, also suffers from drawbacks. For example, when two features have their lengthwise directions aligned to a same straight line, and the line ends of the features face each other, it is difficult to control the uniformity of the line end space due to the proximity effect and overlay variation. The line widths of the features are also difficult to control, especially when there are other features close to these two features.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1 through 15 are top views, perspective views, and cross-sectional views of intermediate stages in the manufacturing of features in a target layer in accordance with some exemplary embodiments.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

Features with fine line spacing and the methods of forming the same are provided in accordance with various exemplary embodiments. The intermediate stages of forming the features are illustrated in accordance with some exemplary embodiments. The variations of the embodiments are discussed. Throughout the various views and illustrative embodiments, like reference numbers are used to designate like elements.

FIGS. 1 through 15 illustrate top views and cross-sectional views of intermediate stages in the formation of features in a target layer in accordance with some exemplary embodiments. Some of figures include a top view and a cross-sectional view of wafer 100 in the same figure, wherein the edges of the illustrated features in the top view may be substantially aligned to the edges of the illustrated features in the respective cross-sectional view.

Figure 1:
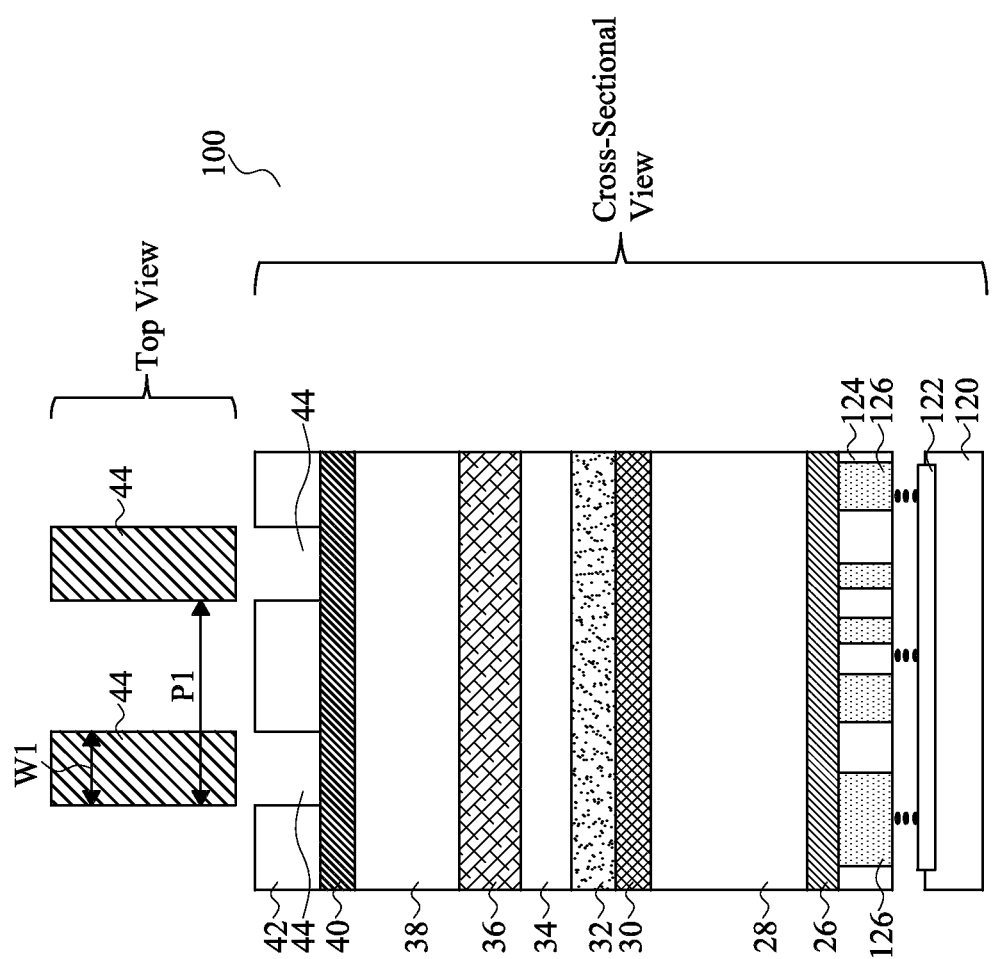

FIG. 1 illustrates wafer 100, which includes substrate 120 and the overlying layers. Substrate 120 may be formed of a semiconductor material such as silicon, silicon germanium, or the like. In some embodiments, substrate 120 is a crystalline semiconductor substrate such as a crystalline silicon substrate, a crystalline silicon carbon substrate, a crystalline silicon germanium substrate, a III-V compound semiconductor substrate, or the like. Active devices 122, which may include transistors therein, are formed at a top surface of substrate 120.

Dielectric layer 124 is formed over substrate 120. In some embodiments, dielectric layer 124 is an Inter-Metal Dielectric (IMD) or an Inter-Layer Dielectric (ILD), which may be formed of a dielectric material having a dielectric constant (k value) lower than 3.8, lower than about 3.0, or lower than about 2.5, for example. In some embodiments, conductive features 126, which may be metallic features such as copper lines or tungsten plugs, are formed in dielectric layer 124. Etch stop layer 26 is formed over dielectric layer 124. Etch stop layer 26 may comprise a dielectric material such as silicon carbide, silicon nitride, or the like.

Dielectric layer 28 is further formed over etch stop layer 26. Dielectric layer 28 may be an IMD layer, which is formed of a dielectric material having a dielectric constant (k value) lower than 3.8, lower than about 3.0, or lower than about 2.5, for example. In alternative embodiments, dielectric layer 28 is a non-low-k dielectric layer having a k value higher than 3.8.

In alternative embodiments, layer 28 is a semiconductor substrate, wherein the subsequent process steps may be used to form Shallow Trench Isolation (STI) regions, for example. In these embodiments, there may not be additional layers underlying layer 28. Throughout the description, layer 28 is also referred to as a target layer that is to be etched, and in which a plurality of patterns is to be formed therein in accordance with embodiments of the present disclosure.

Over low-k dielectric layer 28 resides dielectric hard mask 30, which may be formed of silicon oxide (such as tetraethylorthosilicate (TEOS) oxide), Nitrogen-Free Anti- Reflective Coating (NFARC, which is an oxide), silicon carbide, silicon oxynitride, or the like. The formation methods include Plasma Enhance Chemical Vapor Deposition (PECVD), High-Density Plasma (HDP) deposition, or the like.

Metal hard mask 32 is formed over dielectric hard mask 30. In some embodiments, metal hard mask 32 comprises titanium nitride, titanium, tantalum nitride, tantalum, or the like. The formation methods include Physical Vapor Deposition (PVD), Radio Frequency PVD (RFPVD), Atomic Layer Deposition (ALD), or the like.

Dielectric hard mask layer 34 is formed over metal hard mask 32. Dielectric hard mask layer 34 may be formed of a material selected from the same candidate material of dielectric hard mask layer 30, and may be formed using a method that is selected from the same group of candidate methods for forming dielectric hard mask layer 30. Dielectric hard masks 30 and 34 may be formed of the same material, or may comprise different materials.

Mandrel layer 36 is formed over dielectric hard mask 32. In some embodiments, mandrel layer 36 is formed of amorphous silicon or another material that has a high etching selectivity with the underlying dielectric hard mask 32.

Over mandrel layer 36 resides a tri-layer comprising under layer (sometimes referred to as a bottom layer) 38, middle layer 40 over under layer 38, and upper layer 42 over middle layer 40. In some embodiments, under layer 38 and upper layer 42 are formed of photo resists, which comprise organic materials. Middle layer 40 may comprise an inorganic material, which may be a nitride (such as silicon nitride), an oxynitride (such as silicon oxynitride), an oxide (such as silicon oxide), or the like. Middle layer 40 has a high etching selectivity with relative to upper layer 42 and under layer 38, and hence upper layer 42 is used as an etching mask for the patterning of middle layer 40, and middle layer 40 is used as an etching mask for the patterning of under layer 38. After the application of upper layer 42, upper layer 42 is patterned.

The patterned upper layer 42 includes openings 44 therein. As shown in the top view (also in FIG. 1) of wafer 100, openings 44 may have strip shapes. In some embodiments, pitch P1 of openings 44 is about three times width W1 of openings 44. Throughout the description, the patterns of openings 44 are also referred to as line-A1 patterns.

Figure 2:
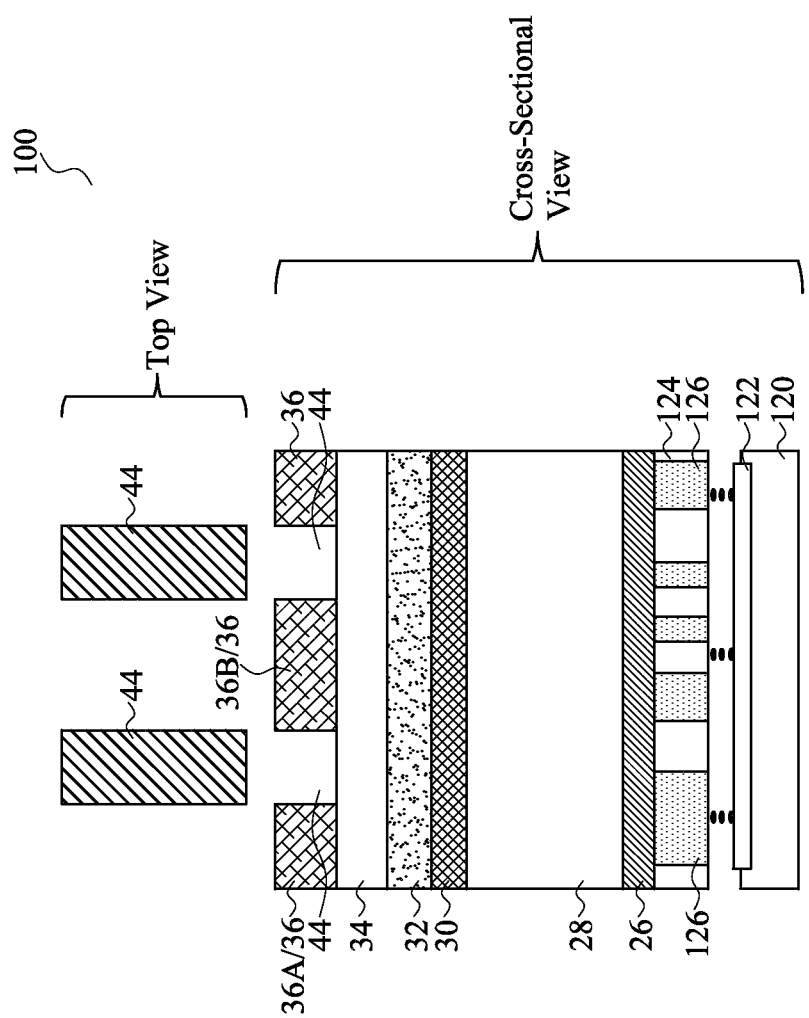

FIG. 1 illustrates a first photo process. Next, a first etching process is performed to transfer the pattern in upper layer 42 to mandrel layer 36, resulting in the structure shown in FIG. 2. During the etching step, upper layer 42, middle layer 40, and under layer 38 may be consumed. If any residue of upper layer 42, middle layer 40, and under layer 38 is left after the patterning, the residue is also removed. The etching is anisotropic, so that openings 44 in mandrel layer 36 have the same sizes as their respective openings 44 in upper layer 42 (FIG. 1). The remaining portions of mandrel layer 36 in FIG. 2 are referred to as intermediate mandrels, which include intermediate mandrels 36A and 36B.

Figure 3:
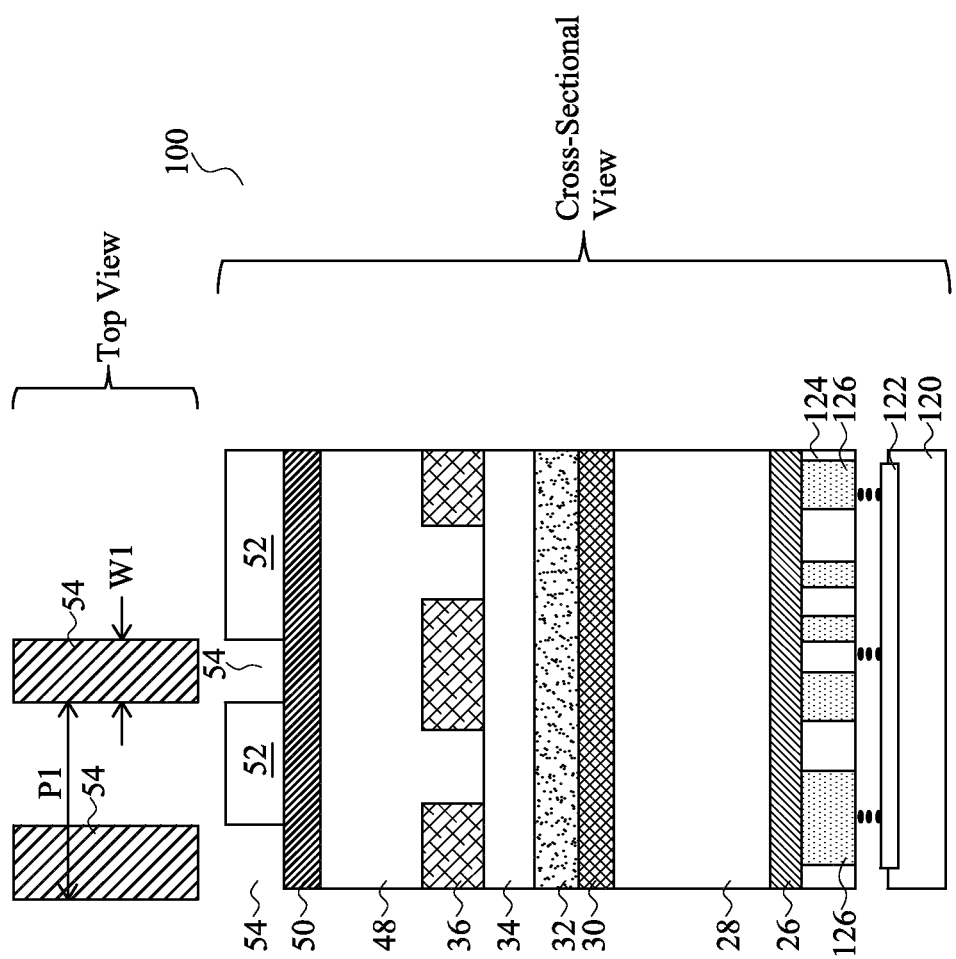
Figure 4:
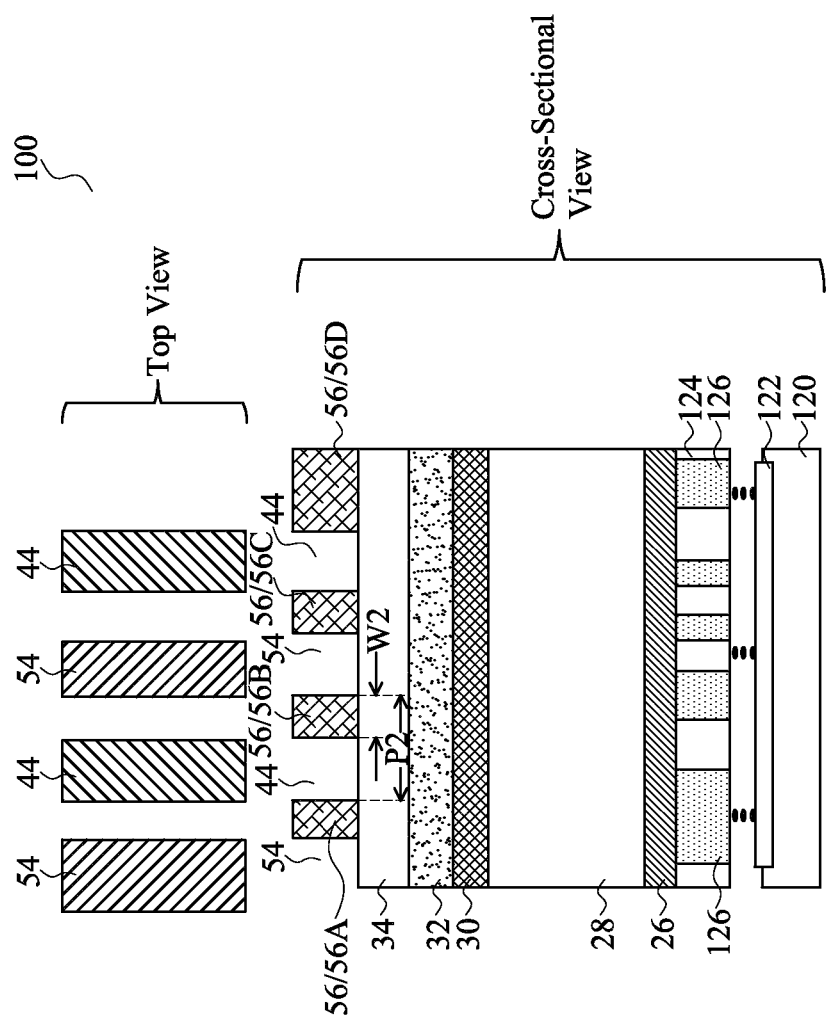

FIGS. 3 and 4 illustrate a second photo and a second etching process performed on mandrel layer 36. Referring to FIG. 3, bottom layer 48, middle layer 50, and upper layer 52 are formed. The materials of bottom layer 48, middle layer 50, and upper layer 52 may be selected from the same candidate materials of bottom layer 38, middle layer 40, and upper layer 42 (FIG. 1), respectively. Upper layer 52 is patterned to form openings 54 therein. Openings 54 may have width W1, which may be substantially the same as the width W1 in FIG. 1, and pitch P1, which is the same as the pitch P1 in FIG. 1. Throughout the description, the patterns of openings 54 are also referred to as line-A2 patterns. Line-A1 patterns and Line-A2 patterns in combination defines the patterns of mandrels 54 as in FIG. 4.

Next, as shown in FIG. 4, the second etching process is performed to extend openings 54 into mandrel layer 36. Bottom layer 48, middle layer 50, and upper layer 52 are either consumed in the etching, or removed if any is left after the etching. As a result, mandrel layer 36 includes both openings 44 and 54, which may be distributed evenly in some embodiments. The remaining portions of mandrel layer 36 are referred to as mandrels 56. As shown in FIGS. 1 through 4, mandrels 56 are the results of the line-A1 patterns (44) as shown in FIG. 1 and the line-A2 patterns (54) shown in FIG. 3. Mandrels 56 may have width W2 equal to about ⅓ width W1, and pitch P2 of mandrels 56 may be equal to about a half of pitch P1 (FIG. 1). Accordingly, the first photo and first etch and the second photo and the second etch, which are in combination referred to as a 2P2E double patterning process, results in W2 and pitch P2 to be smaller than the respective width W1 and pitch P1 (FIG. 1). Width W2 and pitch P2 may be lower than the photolithography limits. Mandrels 56 include mandrels 56A, 56B, 56C, and 56D in the illustrated exemplary embodiments. Mandrel 56A is a remaining portion of intermediate mandrel 36A in FIG. 2, and mandrels 56B and 56C are the remaining portions of intermediate mandrel 36B in FIG. 2.

Figure 5:
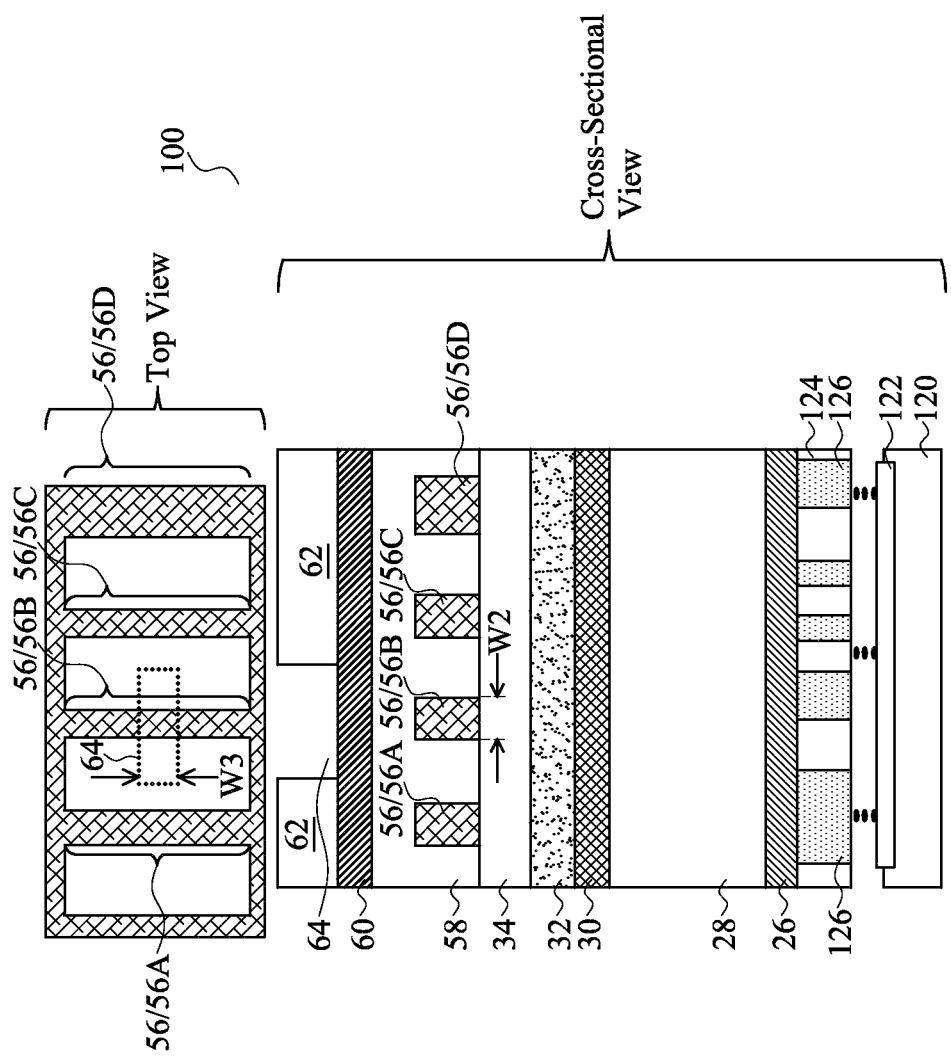
Figure 6:
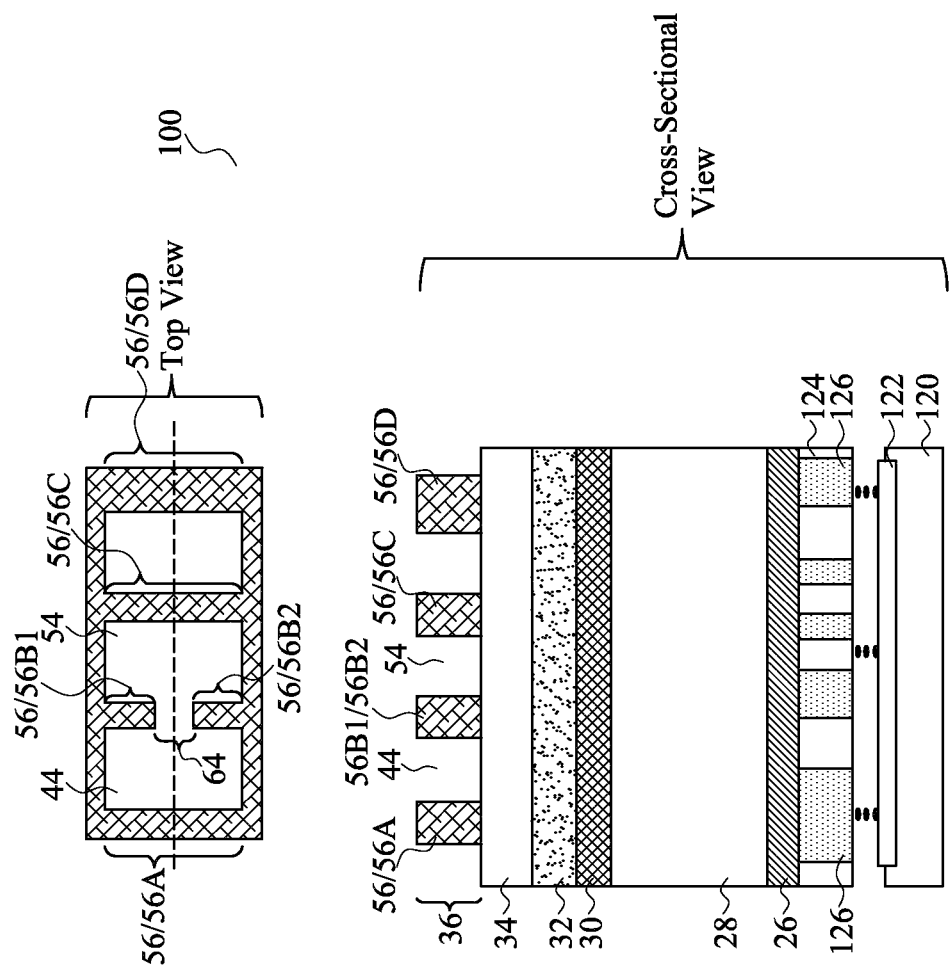

FIGS. 5 and 6 illustrate a cut lithography process, which is used to cut mandrel 56B into two portions. Referring to FIG. 5, bottom layer 58, middle layer 60, and upper layer 62 are formed. The material of bottom layer 58, middle layer 60, and upper layer 62 may be selected from the same candidate materials of bottom layer 38, middle layer 40, and upper layer 42 (FIG. 1), respectively. Upper layer 62 is patterned to form opening 64 therein, wherein a middle portion of mandrel 56B is overlapped by opening 64, while the end portions of mandrel 56B and other mandrels 56 are overlapped by upper layer 62.

Next, as shown in FIG. 6, an etching process is performed to extend opening 64 into mandrel 56B, so that mandrel 56B is cut into two portions 56B1 and 56B2. Bottom layer 58, middle layer 60, and upper layer 62 are either consumed in the etching, or removed if any is left after the etching. As shown in the top view in FIG. 6, the result opening in mandrel layer 36 includes an I-shaped opening, which includes openings 44 and 54, and opening 64 interconnecting openings 44 and 54.

Figure 7:
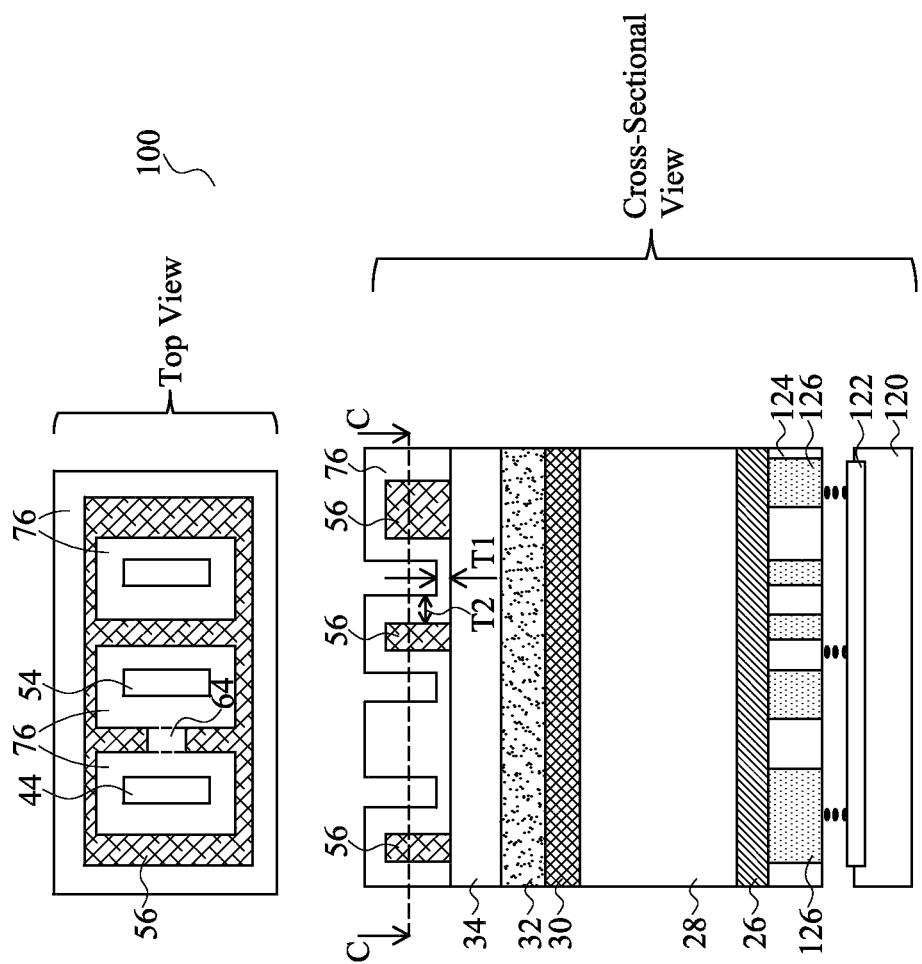

Referring to FIG. 7, spacer layer 76 is blanket formed over the wafer 100 in FIG. 6. The material of spacer layer 76 may be selected from the same group of candidate materials for forming metal hard mask 32 (FIG. 1) or other materials such as dielectric materials that are different from the material of mandrels 56. Furthermore, the material of spacer layer 76 is selected to have a high etching selectivity with dielectric hard mask layer 34 (FIG. 1). For example, the material of spacer layer 76 may be selected from AlO, AlN, AlON, TaN, TiN, TiO, Si, SiO, SiN, metals, and metal alloys.

As also shown in FIG. 7, spacer layer 76 is formed as a conformal layer, with the thickness T1 of its horizontal portions and the thickness T2 of its vertical portions close to each other, for example, with a difference between T1 and T2 smaller than about 20 percent of thickness T1. The top view in FIG. 7 is obtained from the horizontal plane containing C-C in the cross-sectional view.

An anisotropic etching is then performed to remove the horizontal portions of spacer layer 76, while the vertical portions of spacer layer 76 remain, and are referred to as spacers 80 hereinafter. The result structure is shown in FIG. 8.

When spacer layer 76 (FIG. 7) is formed, thickness T2 of spacer layer 76 is selected to be equal to or greater than a half of width W3 (FIG. 5) of opening 64. As a result, as shown in FIG. 8, the sidewall (vertical) portions of spacer layer 76, which sidewall portions are in opening 64 and on opposite sidewalls of mandrels 56B1 and 56B2, merge with each other, as shown in FIG. 7. After the etching as in FIG. 8 is performed, spacers 80 remain to fill an entirety of opening 64. On the other hand, as shown in FIG. 8, openings 44 and 54 have center portions 44'/54' remaining not filled by spacers 80. Dielectric hard mask 34 is exposed through openings 44'/54'.

Figure 8:
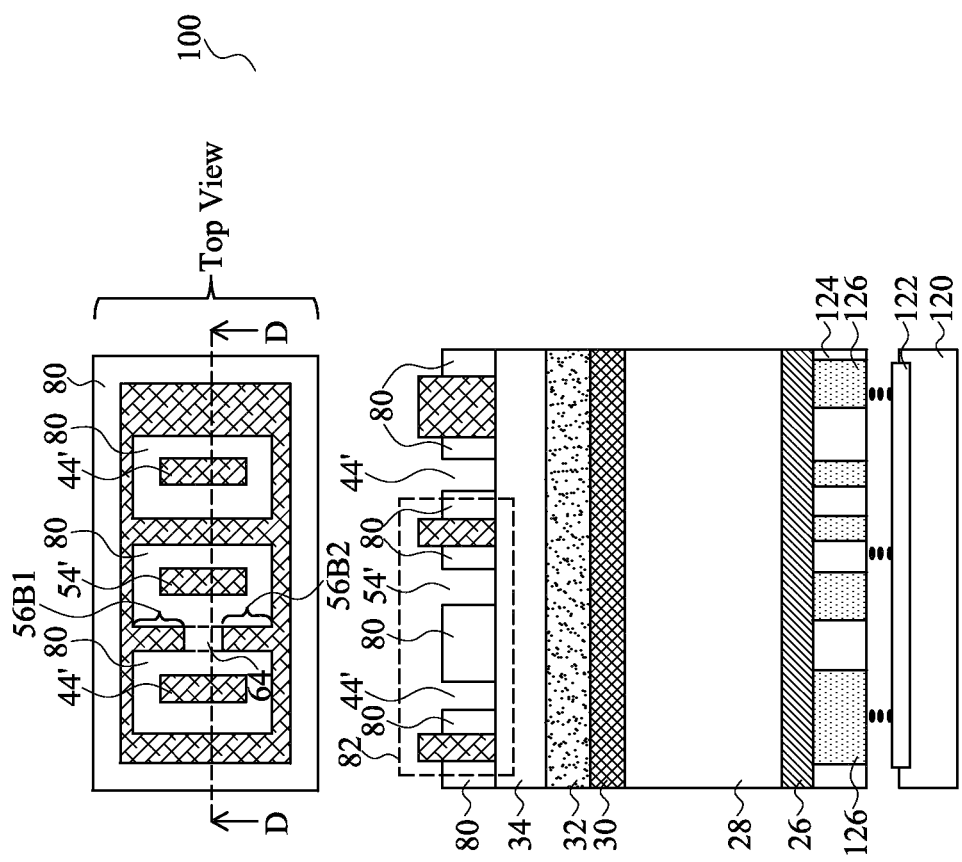

FIGS. 9A and 9B illustrate a perspective view and a top view, respectively, of portion 82 in FIG. 8. As shown in FIG. 9B, opening 44' includes protruding portion 44" connected to major portion of opening 44', which major portion is rectangular. Opening 54' includes protruding portion 54" connected to major portion of opening 54', which major portion is rectangular.

Figure 10:
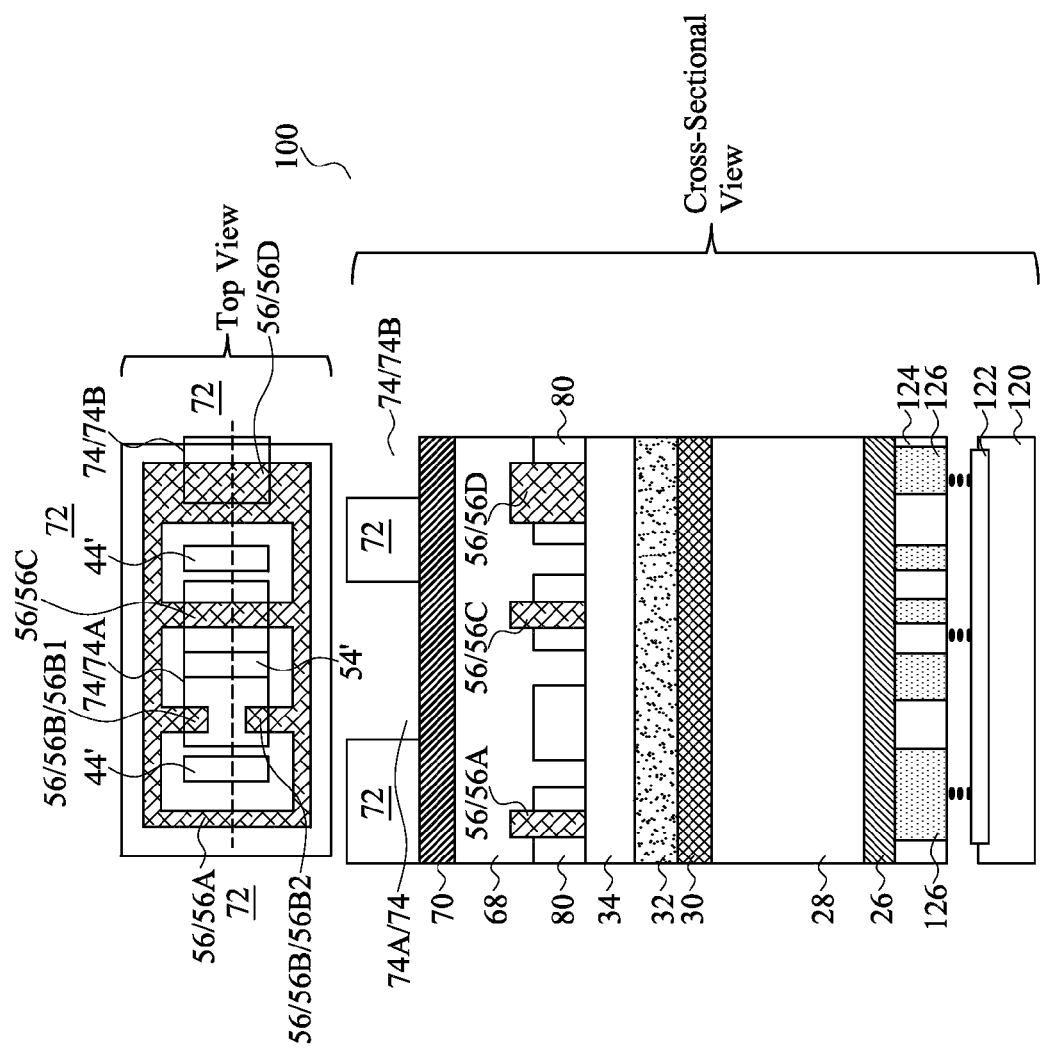
Figure 11:
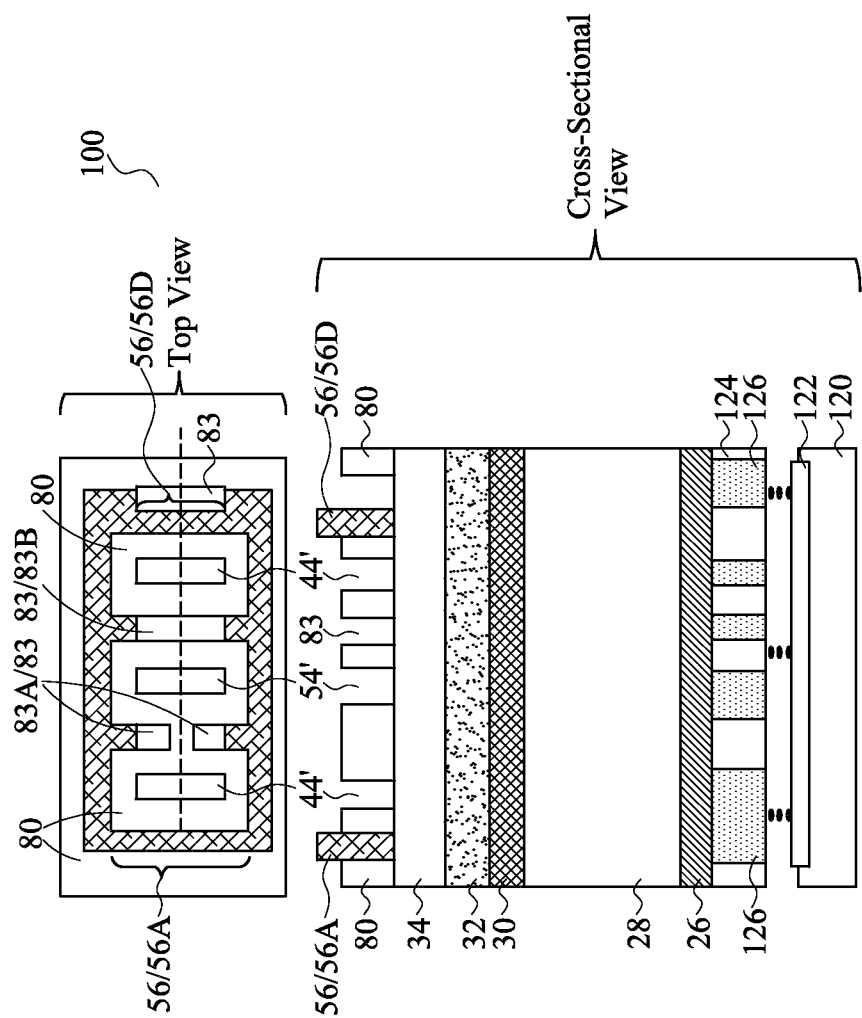

In FIGS. 10 and 11, some undesirable mandrels and mandrel portions, such as mandrels 56B (including 56B1 and 56B2, refer to the top view of FIG. 10) and 56C in FIG. 10, are removed. The process steps are discussed as follows. Referring to FIG. 10, bottom layer 68, middle layer 70, and upper layer 72 are formed. The material of bottom layer 68, middle layer 70, and upper layer 72 may be selected from the same candidate materials of bottom layer 38, middle layer 40, and upper layer 42 (FIG. 1), respectively. Openings 74 (including 74A and 74B) are formed in upper layer 72. Mandrel 56B and 56C is overlapped by opening 74A, while a portion of mandrel 56D is overlapped by opening 74C.

Next, an etching process is performed to remove mandrel portions 56B1 and 56B2 and 56C. The etching is selective so that spacers 80 are not attached, while the exposed mandrels 56 are removed. For example, a part of mandrel 56D is removed, while a portion of mandrel 56D may remain. The resulting openings are shown in FIG. 11, and are referred to as openings 83.

As shown in FIG. 11, openings 83A are formed by removing mandrel portions 56B1 and 56B2 (FIG. 10). Throughout the description, the patterns of openings 83A are referred to as line-B patterns, which have lengthwise directions aligned into a straight line, with the ends of the line-B patterns closely located from each other.

Figure 12:
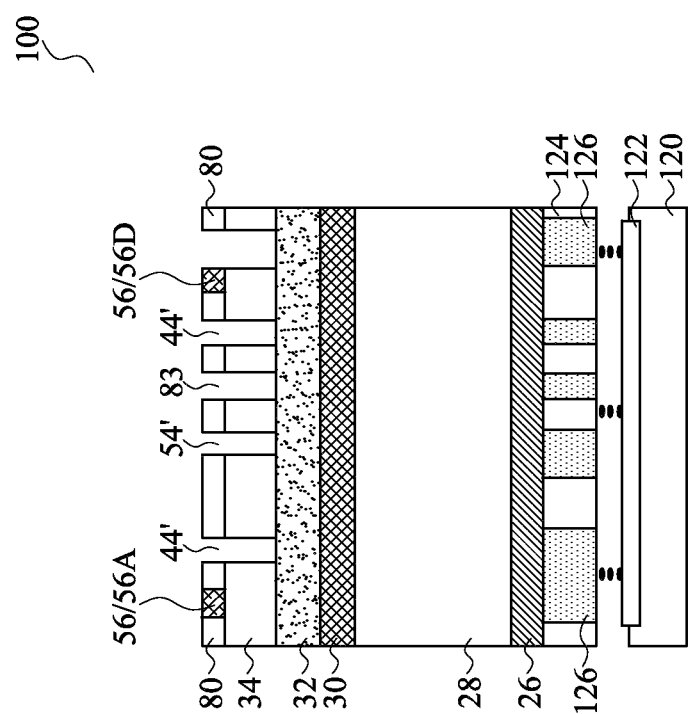

Referring to FIG. 12, mandrels 56 and spacers 80 are in combination used as an etching mask to etch the underlying dielectric hard mask 34, so that openings 44', 54', and 83 extend into dielectric hard mask 34. In the respective process, mandrels 56 and spacers 80 may or may not be fully consumed.

Figure 13:
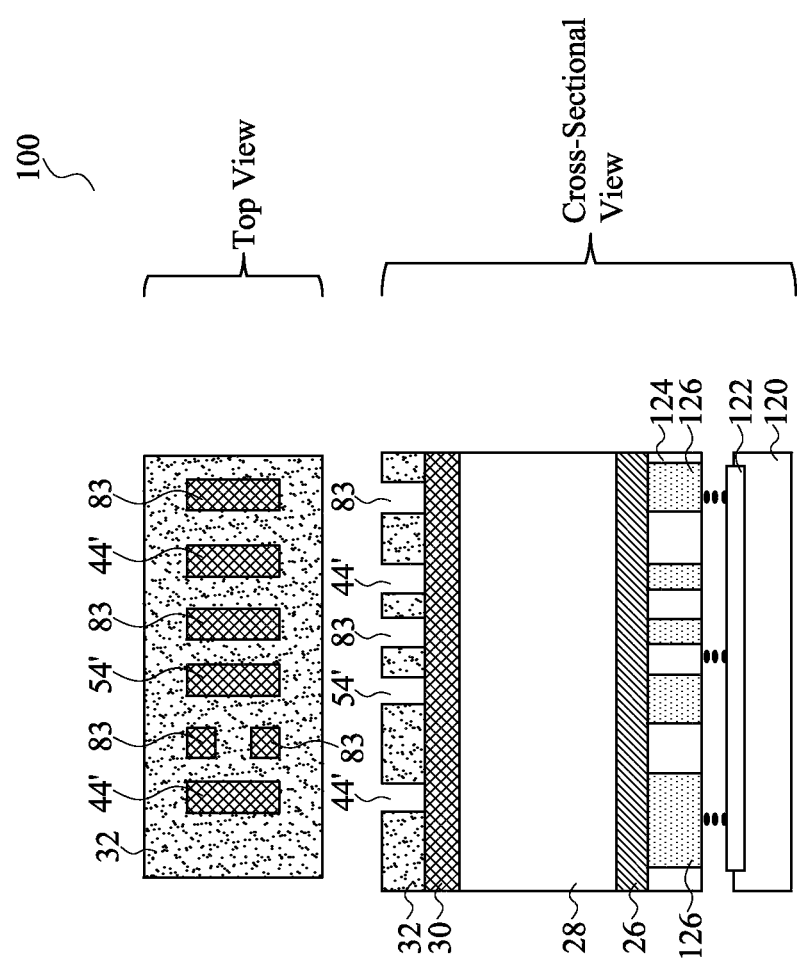
Figure 14:
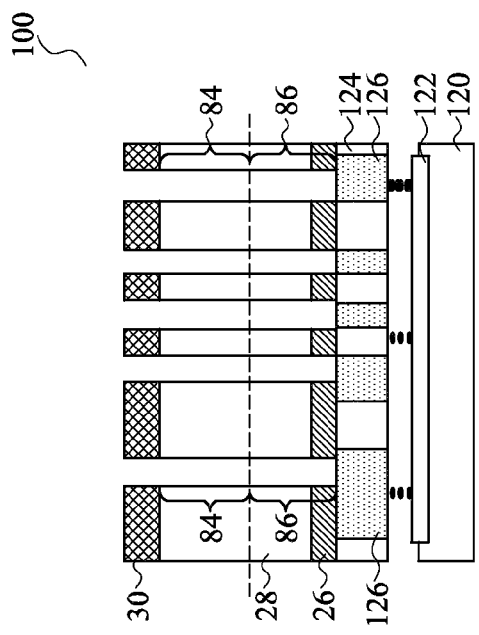

Next, dielectric hard mask 34 is used as an etching mask to etch metal hard mask 32. Mandrels 56 and spacers 80 may be consumed in this process. The resulting structure is shown in FIG. 13. In FIG. 14, the patterned hard mask 32 is used as an etching mask to etch the underlying dielectric hard mask 30, low-k dielectric layer 28, and etch stop layer 26, so that trenches 84 are formed. Additional process steps are also performed to define and etch low-k dielectric layer 28 to form via openings 86 underlying trenches 84. Although trenches 84 and via openings 86 have the same widths in the illustrated plane, in a vertical plane perpendicular to the illustrated plane, via openings 86 have smaller widths than trenches 84.

Figure 15:
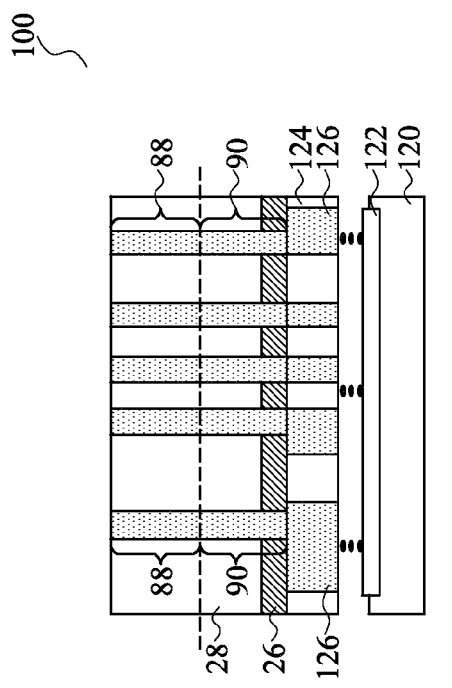

FIG. 15 illustrates the filling of trenches 84 and via openings 86 (FIG. 14) to form metal lines 88 and vias 90, respectively. The formation may include a dual damascene process, wherein a conductive barrier layer such as titanium nitride, titanium, tantalum nitride, tantalum, or the like is formed on the sidewalls and the bottoms of trenches 84 and via openings 86. The remaining portions of trenches 84 and via openings 86 are then filled with a filling metal such as copper or copper alloy. A Chemical Mechanical Polish (CMP) is then performed to remove excess portions of the barrier layer and the filling metal, forming metal lines 88 and vias 90 as shown in FIG. 15. Metal lines 88 and vias 90 are electrically connected to the underlying conductive features 126.

In alternative embodiments, target layer 28 is formed of a semiconductor material. Accordingly, the process step shown in FIGS. 1 through 14 may be used to form trenches in target layer 28, and filling the trenches with a dielectric material to form STI regions.

Figure 16A:
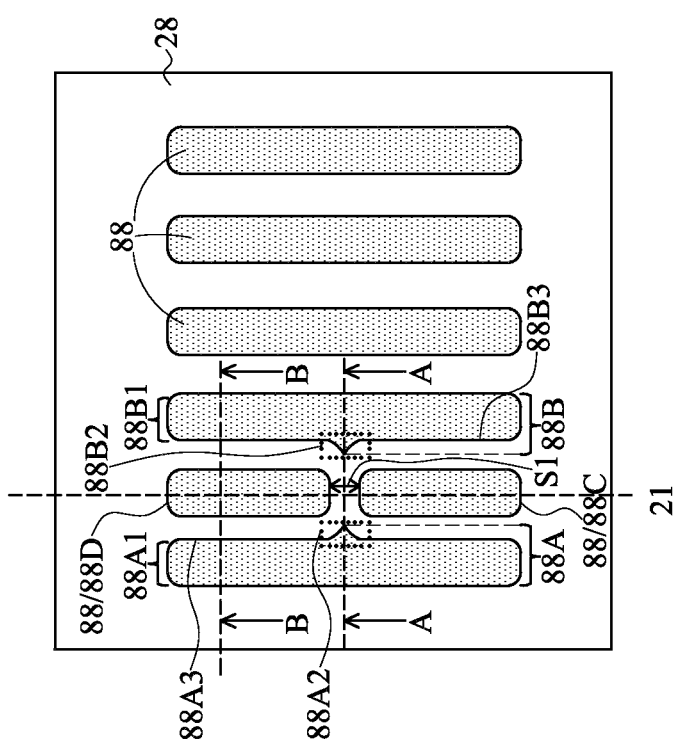
FIGS. 16A through 16C illustrate a top view and cross-sectional views of the features formed in the target layer.

FIG. 16A illustrates a top view of metal lines 88 formed in low-k dielectric layer 28. As shown in FIG. 16A, metal lines 88 include 88A, 88B, 88C, and 88D. Metal lines 88A and 88B are parallel to each other, and are closely located. Metal lines 88A and 88B are formed from openings 44' and 54' (FIG. 11). Metal lines 88C and 88D are located between metal lines 88A and 88B. Metal lines 88C and 88D are formed from openings 83A (FIG. 11). The lengthwise directions (and the lengthwise center lines) of metal lines 88C and 88D are aligned to the same straight line 21. In accordance with some embodiments, line end space Si between metal lines 88C and 88D is between about 5 nm and about 100 nm. It is appreciated, however, that the values recited throughout the description are merely examples, and may be changed to different values.

As shown in FIG. 16A, metal line 88A includes main portion 88A1, which is rectangular, and tip 88A2 protruding beyond edge 88A3 and toward the space between metal lines 88C and 88D. Similarly, metal line 88B includes main portion 88B1, which is rectangular, and tip 88B2 protruding beyond edge 88B3 and toward the space between metal lines 88C and 88D. The tip portions are formed due to the formation of spacers 80, as shown in FIG. 9B, wherein openings 44' and 55' have tip portions.

Figure 16C:
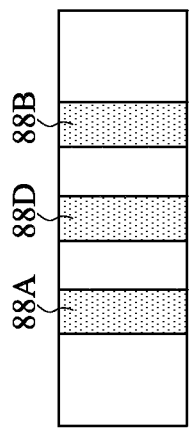
Figure 16B:
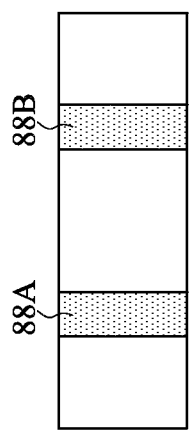

FIGS. 16B and 16C are cross-sectional views of the structure shown in FIG. 16A, wherein the cross-sectional views are obtained from the vertical plane containing lines A-A and B-B, respectively, in FIG. 16A.

The embodiments of the present disclosure have some advantageous features. By adopting the 2P2E process to form metal strips, the widths and spacing of the resulting features are smaller than the limit of lithography processes. Further combining the 2P2E process with the line cutting process, metal lines 88C and 88D (FIG. 18) are formed simultaneously, and do not have double patterning overlay issues. The variation in the line end space is thus minimized. Furthermore, the line end space of features 88C and 88D may be very small since is equal to the minimum size defined by the respective lithography technology.

In accordance with some embodiments, a method includes performing a double patterning process to form a first mandrel, a second mandrel, and a third mandrel parallel to each other, with the third mandrel being between the first mandrel and the second mandrel, and etching the third mandrel to cut the third mandrel into a fourth mandrel and a fifth mandrel, with an opening separating the fourth mandrel from the fifth mandrel. A spacer layer is formed on sidewalls of the first, the second, the fourth, and the fifth mandrels, wherein the opening is fully filled by the spacer layer. Horizontal portions of the spacer layer are removed, with vertical portions of the spacer layer remaining unremoved. A target layer is etched using the first, the second, the fourth, and the fifth mandrels and the vertical portions of the spacer layer as an etching mask, with trenches formed in the target layer. The trenches are filled with a filling material.

In accordance with other embodiments, a method includes forming a mandrel layer over a target layer, performing a first lithography and etching process to pattern the mandrel layer, performing a second lithography-and-etching process and a cut-etch process to pattern remaining portions of the mandrel layer to form a first opening in the mandrel layer. The first opening has an I-shape and includes two parallel portions, wherein the two parallel portions are formed by the first lithography-and-etching process and the second lithography-and-etching process. The first opening further includes a connecting portion interconnecting the two parallel portions. Spacers are formed on sidewalls of the first opening, wherein the spacers fill an entirety of the connecting portion, and wherein a center portion of each of the two parallel portions is unfilled by the spacers. The mandrel layer is etched to remove a portion of the mandrel layer and to form a second opening, wherein the second opening is between the two parallel portions of the first opening. The second opening is spaced apart from the two parallel portions of the first opening by the spacers. The method further includes extending the first opening and the second opening into the target layer.

In accordance with yet other embodiments, a method includes forming a mandrel layer over a target layer, and performing a first lithography-and-etching process to pattern the mandrel layer, wherein remaining portions of the mandrel layer include a first intermediate mandrel and a second intermediate mandrel are formed. The method includes performing a second lithography-and-etching process, wherein a size of the first intermediate mandrel is reduced to form a first mandrel, and the second intermediate mandrel is cut into a second mandrel and a third mandrel, wherein the first mandrel, the second mandrel, and the third mandrel are parallel to each other, with the second mandrel being between the first mandrel and the third mandrel. The method further includes etching the second mandrel to cut the second mandrel into a fourth mandrel and a fifth mandrel, with an opening separating the fourth mandrel from the fifth mandrel. A spacer layer is formed on sidewalls of the first mandrel, the second mandrel, the fourth mandrel, and the fifth mandrel, wherein the opening is fully filled by the spacer layer. Horizontal portions of the spacers are removed, with vertical portions of the spacer layer remaining unremoved.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    forming a mandrel encircling a first opening and a second opening, wherein the first opening and the second opening are separated from each other by a first mandrel strip;
    etching a middle portion of the first mandrel strip to form a third opening connecting the first opening to the second opening, wherein the first mandrel strip comprises a first portion and a second portion remaining on opposite sides of the third opening;
    forming a blanket spacer layer over the mandrel;
    etching horizontal portions of the blanket spacer layer to form spacers, wherein the third opening is fully filled by the spacers, and the first opening and the second opening are narrowed by the spacers;
    etching the first portion and the second portion of the first mandrel strip to form a fifth opening and a sixth opening encircled by the mandrel and the spacers;
    using the mandrel and the spacers as an etching mask to etch a target layer, with trenches formed in the target layer; and
    filling the trenches with a filling material.

2. The method of claim 1, wherein the forming the mandrel comprises:
    forming a blanket mandrel layer over the target layer;
    performing a first etching to remove some portions of the blanket mandrel layer; and
    performing a second etching on remaining portions of the blanket mandrel layer to form the mandrel.

3. The method of claim 1 further comprising, removing the mandrel and the spacers.

4. The method of claim 1 further comprising, after the etching the horizontal portions of the blanket spacer layer and before the target layer is etched, removing a second mandrel strip parallel to the first mandrel strip.

5. The method of claims further comprising, when the fifth opening and the sixth opening are formed, simultaneously etching a portion of the mandrel to form a third mandrel strip parallel to the first mandrel strip.

6. The method of claim 1, wherein the target layer comprises a dielectric material, and wherein the filling the trenches comprises filling a metallic material.

7. The method of claim 1, wherein the mandrel comprise amorphous silicon.

8. A method comprising:
    forming a mandrel layer over a target layer;
    patterning the mandrel layer to form a first opening in the mandrel layer, wherein the first opening has an I-shape and comprises:
        two parallel portions; and
        a connecting portion interconnecting the two parallel portions;
    forming spacers on sidewalls of the first opening, wherein the spacers fill an entirety of the connecting portion, and the two parallel portions are narrowed by the spacers;
    etching the mandrel layer to remove portions of the mandrel layer on opposite ends of the connecting portion to form a second opening and a third opening, wherein the second opening and the third opening are between the two parallel portions of the first opening; and extending the two parallel portions of the first opening, the second opening, and the third opening into the target layer, wherein in the extending, the mandrel layer and the spacers in combination are used as an etching mask for etching the target layer.

9. The method of claim 8 further comprising:
etching a hard mask underlying the mandrel layer to extend the second opening, the third opening, and remaining portions of the first opening into the hard mask, wherein the target layer is etched using the hard mask as an etching mask.

10. The method of claim 8 further comprising, after the second opening, the third opening, and remaining portions of the first opening are extended into the target layer, filling the first opening and the second opening with a material different from the target layer.

11. The method of claim lo further comprising removing the spacers.

12. The method of claim 8, wherein the forming the spacers comprises:
forming a spacer layer having a thickness equal to or greater than a half of a width of the connecting portion of the first opening; and
performing an anisotropic etching on the spacer layer, wherein portions of the spacer layer remaining after the anisotropic etching are the spacers.

13. The method of claim 8, wherein the patterning the mandrel layer to form the first opening comprises:
performing a first lithography-and-etching process to form a first one of the two parallel portions; and
performing a second lithography-and-etching process to form a second one of the two parallel portions.

14. The method of claim 8, wherein when the two parallel portions are narrowed by the spacers, the two parallel portions have portions unfilled by the spacers, and the unfilled portions are at a same level as the mandrel layer.

15. A method comprising:
forming a mandrel layer over a target layer;
performing lithography-and-etching processes to pattern the mandrel layer, with remaining portions of the mandrel layer comprising a first mandrel, a second mandrel, and a third mandrel parallel to each other, with the second mandrel being between the first mandrel and the third mandrel;
etching the second mandrel to cut the second mandrel into a fourth mandrel and a fifth mandrel, with an opening separating the fourth mandrel from the fifth mandrel;
forming a blanket spacer layer over the first mandrel, the second mandrel, the fourth mandrel, and the fifth mandrel; and
performing an anisotropic etching on the blanket spacer layer, wherein the opening is fully filled by a remaining portion of the blanket spacer layer.

16. The method of claim 15 further comprising:
using the first mandrel, the second mandrel, the fourth mandrel, and the fifth mandrel and the remaining portions of the blanket spacer layer as an etching mask to etch the target layer, with trenches formed in the target layer; and
filling the trenches with a filling material.

17. The method of claim 16, wherein the target layer comprises a dielectric material, and the filling the trenches comprises filling a metallic material to form metal lines and vias.

18. The method of claim 15, wherein the first mandrel, the second mandrel, and the third mandrel comprise amorphous silicon.

19. The method of claim 15 further comprising, after the anisotropic etching and before the target layer is etched, removing a sixth mandrel parallel to the first mandrel.

20. The method of claim 15 further comprising, after the anisotropic etching and before a layer underlying the blanket spacer layer is etched, removing a first portion of a sixth mandrel, with a second portion of the sixth mandrel remaining.

* * * * *